United States Patent [19]

Klesse et al.

[11] 4,204,935
[45] May 27, 1980

[54] THIN-FILM RESISTOR AND PROCESS FOR THE PRODUCTION THEREOF

[75] Inventors: Fritz Klesse, Landshut; Jürgen Förster, Freising, both of Fed. Rep. of Germany

[73] Assignee: Resista Fabrik Elektrischer Widerstände G.m.b.H., Landshut, Fed. Rep. of Germany

[21] Appl. No.: 908,679

[22] Filed: May 23, 1978

Related U.S. Application Data

[63] Continuation-in-part of Ser. No. 764,015, Jan. 31, 1977, abandoned.

[30] Foreign Application Priority Data

Feb. 10, 1976 [DE] Fed. Rep. of Germany ....... 2605174

[51] Int. Cl.² .......................... C23C 15/00; H01C 7/06
[52] U.S. Cl. ............................... 204/192 F; 252/513; 338/308
[58] Field of Search ................... 204/192 F; 338/308; 427/101; 252/513

[56] References Cited

U.S. PATENT DOCUMENTS

| | | | |
|---|---|---|---|
| 3,400,066 | 9/1968 | Caswell et al. ...................... 204/192 |
| 3,477,935 | 11/1969 | Hall ...................................... 204/192 |
| 3,969,278 | 7/1976 | Aksenov et al. ...................... 252/513 |
| 4,021,277 | 5/1977 | Shirn .................................... 156/657 |

FOREIGN PATENT DOCUMENTS 515167  5/1976  U.S.S.R. ................................. 252/513

OTHER PUBLICATIONS

L. T. Maissel et al., "Handbook of Thin Film Technology," McGraw-Hill, N.Y., 1970, pp. 1-78 to 1-80 and 18-8 to 18-12.
E. M. Michalak, "Low Energy Sputtering of Resistive Films," Vacuum, vol. 17 (1967), pp. 317-324.
S. A. Halaby et al., "The Materials of Thin-Film Devices," Electro-Technology, Sep. 1963 pp. 105-107.

Primary Examiner—John H. Mack
Assistant Examiner—William Leader
Attorney, Agent, or Firm—Otto John Munz

[57] ABSTRACT

Thin-film resistors with an insulating carrier member and a resistor film applied to the carrier member, in which the resistor film is a chrome-nickel film containing an added amount of at least one of the metals gold, aluminum, cobalt or tin, are disclosed, as well as the process for their production by reactive atomization (sputtering) of the metals in the presence of oxygen.

10 Claims, 3 Drawing Figures

THIN-FILM RESISTOR AND PROCESS FOR THE PRODUCTION THEREOF

CROSS REFERENCES TO RELATED APPLICATIONS

This application is a continuation-in-part of Ser. No. 764,015 filed Jan. 31, 1977 now abandoned. Priority under 35 USC 119 is claimed based on the corresponding German application Number P 26 05 174.1 filed Feb. 10, 1976.

FIELD OF THE INVENTION

The present invention relates to thin film resistors having an insulating carrier member on which a resistor film is deposited, and to the process for producing them.

DISCUSSION OF THE PRIOR ART

Thin-film resistors are known in the form of metal oxide film resistors wherein tin dioxide is used as the metal oxide. Metal oxide film resistors of this kind are generally produced by spraying tin tetrachloride mixed with hydrochloric acid and water on an insulating carrier member which has been heated to about 800° C. and which generally consists of glass or ceramics. The chemical reactions therefrom lead to the formation of tin dioxide on the carrier members while hydrogen chloride is formed. To control the temperature coefficient of the resistor layer, antimony chloride may also be added to the tin chloride solution. Such processes are carried out in such a way that the insulating carrier members are placed in a vapor of the atmosphere mentioned above whereby they pass downwardly, for example, through a vapor zone.

Both the material of the resistor layer and also the quality of the resistor layer are of essential importance to the quality of thin-film resistors of this kind. For example, the uniformity of the resistor layer is very important for the stability of the resistance value. Only a certain degree of homogeneity of the resistor layer can be obtained with a spray process of the kind described above. This limitation becomes apparent by virtue of the fact that when the resistor is operated for about 10,000 hours a change in the resistance value of up to 4% or more occurs.

Furthermore, the material and the quality of the resistor layer also have a substantial effect on the temperature coefficient of the resistor. If the fact that the temperature coefficient is a function of the temperature in sprayed on layers of the kind mentioned above is taken into account, a change in the temperature coefficient of up to 250 units takes place within the range from −55° C. to +175° C.

Other important electrical data of resistors of the kind described are the resistance range, the resistance tolerances, the electrical load at a given temperature of the environment, the maximum operational voltage, the change in values under the effect of moisture and the non-linearity.

SUMMARY OF THE INVENTION

The present invention overcomes the above mentioned limitations of the prior art by providing a thin-film resistor having improved climatic stability and inner stability under stress compared with the above-mentioned resistors having a resistor film of tin dioxide, and a process for producing the resistor.

Accordingly, it is an object of the present invention to produce a thin-film resistor having a resistor film formed of a chrome-nickel layer containing an added amount of at least one of the metals gold, aluminum, cobalt and tin.

Another object of the present invention is to provide a process for producing a thin-film resistor by depositing a resistor film on an insulating carrier by reactive atomization or sputtering of the metals chrome and nickel with an added amount of at least one of the metals gold, aluminum, cobalt and tin in the presence of oxygen.

DESCRIPTION OF THE PREFERRED EMBODIMENTS

According to the present invention, resistor layers are deposited on insulating carrier members by reactive atomization or sputtering (cathode atomization). In cathode atomization, metal atoms are released from a cathode (target) in a vacuum by means of accelerated argon ions and then condensed on the carrier members. If the residual gas contains oxygen, oxidation of the metal atoms may occur. This reaction, like the entire coating process, is determined essentially by the rate of atomisation and depositing, the partial pressures, the geometry of the apparatus for carrying out the process and the temperature of the carrier members and target. Moreover, the properties of the deposited resistor layers also depend to a decisive degree on the ratios of quantities of the individual elements to one another and their properties in the crystal combination.

Oxidation of the metal atoms may occur on the target itself, during the transportation stage in the plasma chamber and also during the condensation phase on the carrier members.

Since it can generally be assumed that the composition of the resistor layers is determined by the velocities of the particles hitting the surfaces of the carriers, while the condensation coefficient, re-atomization and reactivity should be taken into account, oxidic phases will be formed when there are high partial pressures of oxygen and low metal atomization rates. When there are small partial pressures of oxygen and high metal atomization rates, resistor layers of a predominantly metallic nature can be expected.

Therefore, as a further development of the invention, it is possible to adjust the partial pressures of oxygen and the metal atomization rate so that either metal oxide layers or layers of metallic nature are obtained as the resistor film. Between these two extremes, transitional phases or mixtures of metal and metal oxide are formed.

Furthermore, the temperature of the insulating carrier member also affects the film structure. Since adhesion and re-atomization effects the dependent on temperature, the temperature of the carrier members affects the composition of the film. The temperature of the carrier members has an even greater effect on the structure of the deposited films. With cooled carrier members, structures which simply reproduce the frozen condensed state of the particles hitting the carrier members can be expected. The films are then amorphous rather than crystalline. In the case of carrier members at high temperatures, marked crystal structures can be expected. In film resistors, this manifests itself primarily in good nonlinearity values. Thus, depending on the film structure desired, the temperature of the insulating carrier member can be varied widely, for example from 220° C. to 350° C.

The production of resistors according to the invention will now be described in detail with reference to a cathode atomizer arrangement shown in FIG. 1.

Figure 1:
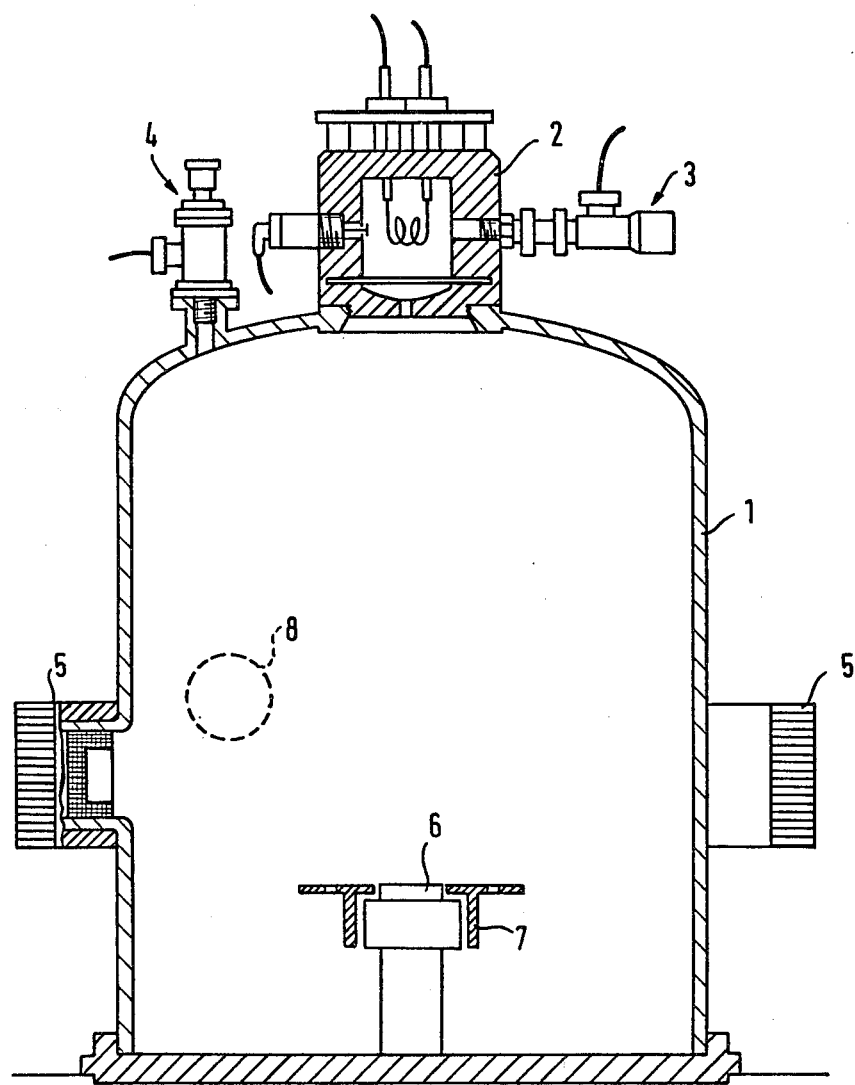
FIG. 1 shows an apparatus for carrying out the process of the present invention.

The cathode atomizer arrangement according to FIG. 1 comprises a reaction chamber 1 on the upper side of which is provided an ionization chamber 2. On this ionization chamber 2 is provided a metering valve 3 through which is passed an inert gas, for example argon, required for igniting and maintaining an arc-discharge in the reaction chamber. A reactive gas, for example air, is passed into the reaction chamber through a metering valve 4 provided on the reaction chamber 1. There is also provided, on the outer periphery of the reaction chamber 1, a magnet coil 5. Inside the reaction chamber is located a target (cathode) 6 containing the metals to be atomized and surrounded by an anode 7.

The carrier members of the resistors to be coated are placed in a rotary basket apparatus (not shown in detail) wherein the baskets can both rotate about their own axis and also travel around the target 6. A basket of this kind is diagrammatically shown inside the reaction chamber 1 and designated 8.

Before the actual coating process of the insulating resistor carriers in the manner according to the invention with chrome-nickel and an added amount of at least one of the metals gold, aluminium, cobalt and tin, the reaction chamber 1 is sufficiently evacuated and the resistor carriers are heated to about 300° C. Due to the above-mentioned double movement of the carrier members in a rotary basket device, more homogeneous heating and atomization is obtained. Both these parameters have a great effect on the film properties.

If the conditions in the reaction chamber 1 are chosen to be such that the atomization rate of the target 6 is greater than the rate of deposit on the carrier members, which can be achieved by means of relatively large spacings of the baskets 8 containing the resistor carrier members from the target 6, the target surface remains constantly clean, and reproducible atomization rates are guaranteed when there is reactive gas in the reaction chamber 1. In a practical example, a partial pressure range of oxygen of from $1 \times 10^{-6}$ to $1 \times 10^{-4}$ Torr is available for the oxidation of the films to be applied owing to the large difference between the depositing rate and the atomization rate. With greater depositing rates, one can work on the assumption that even atoms oxidized on the target 6 do not have any decisive effect on the composition of the resistor film.

Furthermore, it should also be mentioned that the reactive gas is introduced directly into the reaction chamber via the metering valve 4 while the inert gas is first passed through the metering valve 3 into the ionization chamber 2. In this way it is ensured that the level of ionization of the reactive gas remains relatively low even after ignition of the arc-discharge.

If the reactive atomization (sputtering) is carried out under these conditions, the chemical reactions determining the structure of the film primarily occur directly in the layers on the resistor carrier members.

After evacuating and heating the reaction chamber 1, the necessary partial pressure of the reactive gas, air, in the present example, is adjusted by means of the metering valve 4. A mass spectrometer may be used to measure this partial pressure. The pressure of the inert gas, argon, in the present example, required to ignite and maintain the arc-discharge is then adjusted to a pressure of about $7 \times 10^{-4}$ Torr via the metering valve.

After the partial pressures have been set and the arc-discharge ignited, the metal atomization rate is adjusted and kept constant by means of the target voltage and current so that, for a given spacing of the resistor carrier members in the baskets 8, a given condensation rate is obtained. The proportion of above-mentioned metal additives consisting of the elements gold, aluminum, cobalt or tin can be adjusted, for example, according to the degree of bunching. The proportion of the elements chromium, nickel and the metal additive deposited as a thin-film in their metallic form or in the form of oxides can thus be varied widely depending on the resistance and properties desired in the thin-film resistor. For example, the mole percentage of chromium or chromium compound, in the film can range from 30% to 80%, preferably 40% to 60%. The mole percentage of nickel as the metal or a compound thereof can be from 10% to 35%, preferably 20% to 35%, and the mole percentage of the additive metal (gold, aluminum, cobalt or tin) can be 10% to 35%, preferably 15% to 25%.

As soon as the system is in equilibrium, i.e. as soon as any oxide layers on the target 6 have been atomized and are being given off at a constant speed, the resistor carrier members are exposed and ready for coating. After a given time, which is substantially a function of the surface resistance required, the coating is stopped or switched to another target. For higher ohmic layers, it has proved necessary to change the method of atomization for individual areas of the layer. This applies both to the partial pressure of oxygen and also to the ratio of the individual metals to one another.

Following the coating process, the tempering is carried out at about 300° C. for several hours. The other production steps are substantially those used for resistors of a covered and enamelled construction, for which it is particularly likely that the resistor layer will be coated with silicone lacquer or surrounded with a suitable plastic.

An important factor in the operation of thin-film resistors produced in accordance with the present invention is the stability of the resistance value under thermal and electrical stress. If film resistors are exposed to electrical or thermal stress for a fairly long period, changes in resistance occur. Their magnitude depends on the surrounding temperature, the level and duration of stress and the surface resistance. In contrast to metal film resistors which generally take on greater resistance values in the course of time, oxide film resistors frequently tend to take on smaller resistance values in the course of time. This very characteristic behaviour occurs even at temperatures of $\leq 150°$ C.

Figure 2:
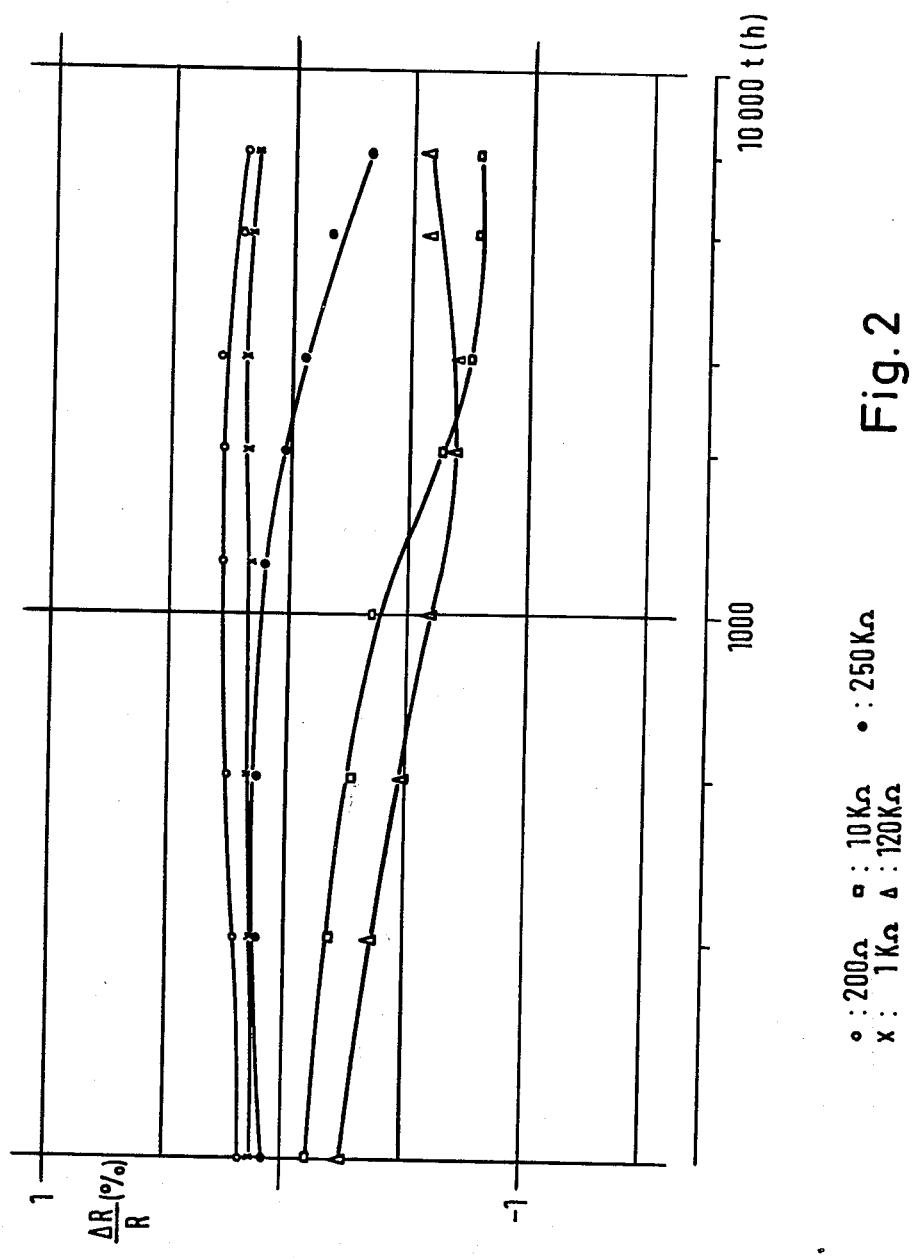
FIGS. 2 and 3 each represent a diagram showing the change in resistance levels under electrical load and thermal load, respectively.
Figure 3:
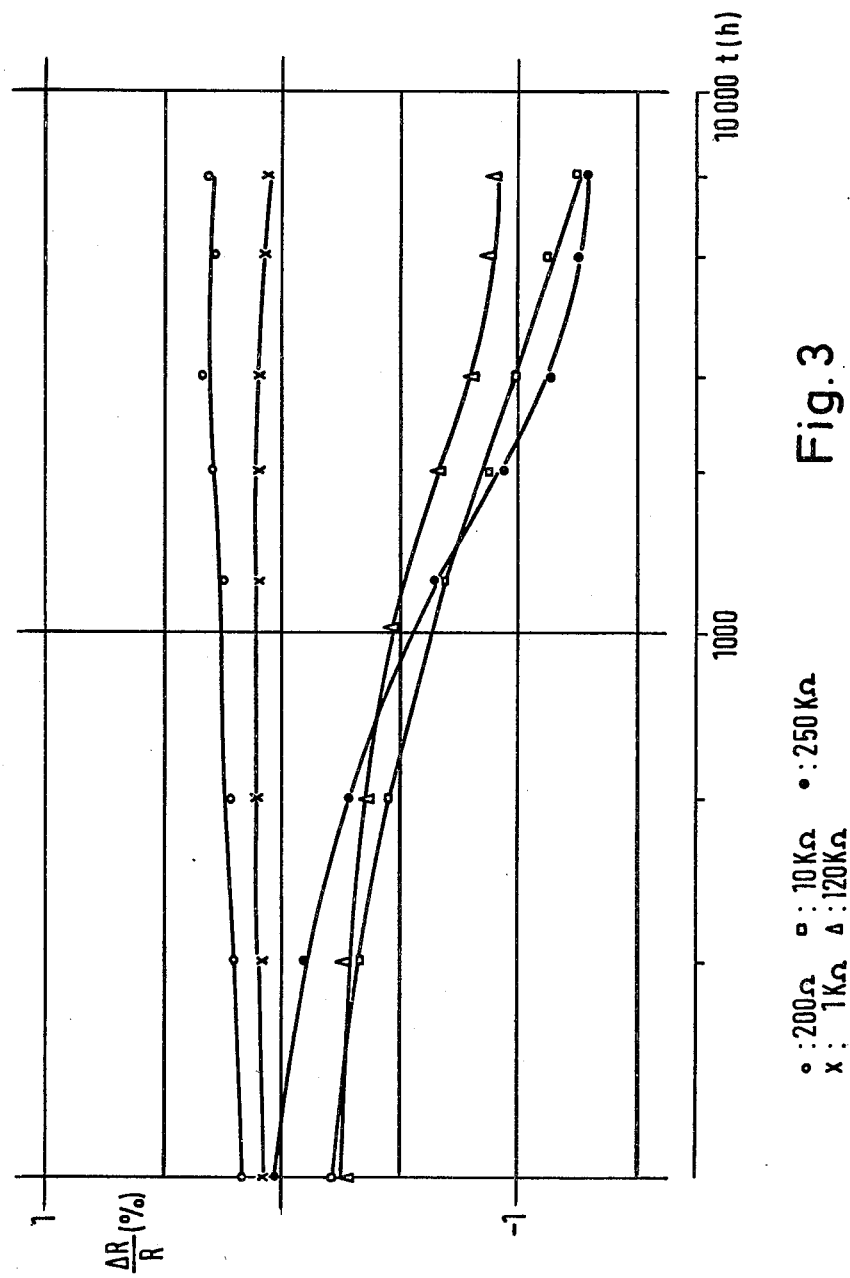

As shown by FIGS. 2 and 3, this behavior can also be observed in metal oxide resistor films produced according to the present invention. FIG. 2 shows the change in the resistance value $\Delta R/R$ in % as a function of time t in hours (h) under electrical stress ($P_{70} = 1$ Watt) for different recorded resistance values. FIG. 3 shows the change in the resistance values $\Delta R/R$ in % as a function of time t in hours (h) when stored in heat at 200° C. for different recorded resistance values.

A characteristic of oxide layers produced according to this invention is that they can be subjected to relatively high thermal stress. Thus, for example, film temperatures of up to 200° C. are acceptable with oxide films produced according to this invention. With conventional metal oxide resistors, a change in resistance of up to 4% and sometimes even more must be expected under thermal stress at 200° C. over 10,000 hours. With thin-film resistors produced according to the present invention, a change in resistance of only up to 1.5% occurs under corresponding thermal stress.

These advantages result from the relatively slow and uniform application of the films in which the formation of the film in reactive atomization is completed by the accumulation of atoms or molecules. For example, the process of reactive atomization according to the present invention is conducted for a period of 0.5 hours to 3 hours, preferably 1 hour to 2 hours. In the known spray process mentioned hereinbefore, it is impossible to obtain such uniformity, particularly when applying very thin films, since the coating process occurs in quanta of atom and molecule combinations. Therefore, with sprayed on films, a crystalline structure is not obtained over large areas except by a lengthy aging process.

With the resistors produced according to the invention, correspondingly favorable characteristics are also obtained as a function of time under electrical stress and at a given temperature. This result is substantially just as favorable as with the thermal stress mentioned above.

Another important property of resistors is their insensitivity to the effects of moisture. This property is determined not so much by the quality of the films but rather by the casing, the electrical field intensities occurring in the resistor and the magnitude of the surface resistance. If the electrical field intensities occuring in the resistor, and the magnitude of the surface resistance are taken into account by coiling the resistor film and the resistor film thus coiled is surrounded with a moisture-resistant protective layer, for example a silicone lacquer, the moisture resistance is at least as good as that of previously known resistors.

When resistors are subjected to electrical and thermal stress, not only irreversible but also reversible changes in the resistance value must be expected. A measurement of the most important reversible change in value is provided by the temperature coefficient.

In resistors produced according to the present invention, temperature coefficient values of $\leq \pm 200 \times 10^{-6}$ per ° C. are obtained. Typical values are $\leq -125 \times 10^{-6}$ per ° C. The dependency of the temperatures coefficient on the temperature within the range from $-55°$ C. to $175°$ C. is $\leq 50$ units. By comparison, with sprayed-on oxide layers, values of up to 250 units are obtained in the same temperature range.

Another feature of quality of film resistors is their non-linearity. This magnitude is shown, for example, in the fact that when the resistor is stressed with a purely sinusoidal current of fundamental frequency, portions with integral multiples of the fundamental frequency occur which produce voltages of the integral multiples of the fundamental frequency. As a measurement of the non-linearity, the ratio of the voltage applied to the voltage with three times its frequency is determined by the formula $$A_3 = 20 \log (V_1/E_3)$$

Here $V_1$ represents the voltage applied, $E_3$ represents the voltage with three times the frequency, log represents the logarithm to the base 10, and $A_3$ is the measurement of non-linearity. Thus, the non-linearity is high when the $E_3$ value is small, and vice-versa. In the resistance standards, the maximum allowable values for this ratio are given for the individual types of film, sizes of resistors and nominal values of resistors; and these should not be exceeded by at least 95% of a group of resistors. Here too, it is apparent that the resistors according to the invention are far from exceeding the acceptable limits.

Finally, electrical data of a resistor produced according to the present invention with a ceramic cylinder as the carrier member, a metal oxide film, covers, connecting wires soldered onto the covers with lead-tin solder and a silicon lacquer coating with threshold values according to DIN 44063 are compared in Table 1 below which shows the advantages of resistors produced according to the invention in a particularly striking manner. The values are obtained from a test with resistors of DIN size 0414.

TABLE 1

|  | Threshold values according to DIN 44063 | Typical values of resistor according to invention |
|---|---|---|
| Resistance range | 10 Ohm–100 kOhm | 1 Ohm to 10 |
| Resistance tolerances | 2% and 5% | 2% and 5% |
| Electrical stress at ambient temp. of 70° C. | 0.5 Watt | 1 Watt |
| Maximum operational voltage | 350 V | 350 V |
| Temperature coefficient | $\leq 400 \times 10^{-6}/°$ C. | $\leq 200 \times 10^{-6}/°$ C. |
| Change in resistance after 1,000 hours at 70° C. and 1 Watt of electrical stress | ±2% | $\leq \pm 1\%$ |
| Change in resistance after 10,000 hours at 70° C. and 1 Watt of electrical stress | ±4% | $\leq \pm 1.5\%$ |
| Change in value under the effect of moisture | 1.5% | $\leq \pm 0.5\%$ |
| Non-linearity (1,000 kOhm) | $\geq 85$ | $\geq 110$ dB |

The invention is further illustrated by the following example.

EXAMPLE

Using the apparatus of FIG. 1, a series of thin film resistors were made by using ceramic material as the insulating carrier member and a target comprising chromium, nickel and gold. The carrier member was heated to a temperature of about 250° C., the partial pressure of the inert gas, argon, was adjusted to $7 \times 10^{-4}$ Torr and the partial pressure of reactive gas, air, was $2 \times 10^{-5}$ Torr. Sputtering was continued for one hour. Variations in the estimated metal content of the thin-film resistors were obtained by compound of target electrode.

After sputtering, the thin film resistors were subjected to tempering at a temperature of 300° C. for 5 hours. Following the tempering the surface resistance of each resistor was measured. The results are summarized in Table 2 below.

TABLE 2

| Estimated Composition (MOLE %) | | | Surface Resistance | Thickness |
|---|---|---|---|---|
| Cr | Ni | Au | (Ohms/square) | nm (nanometers) |
| 30 | 35 | 35 | 10 | 300 |

TABLE 2-continued

| Estimated Composition (MOLE %) | | | Surface Resistance | Thickness |
|---|---|---|---|---|
| Cr | Ni | Au | (Ohms/square) | nm (nanometers) |
| 40 | 30 | 30 | 100 | |
| 60 | 20 | 20 | 500 | |
| 80 | 10 | 10 | 1 k | |

What is claimed is:

1. Process for the production of a thin-film resistor with an insulating carrier member and a resistor film applied to the carrier member, comprising the steps of:
depositing the resistor film on the insulating carrier member by reactive sputtering of the metals chromium and nickel with an added amount of at least one of the metals selected from the group consisting of gold, cobalt, aluminum, and tin, the composition of said film being 30–80 mole percent chromium or chromium compound, 10–35 mole percent nickel or nickel compound and 10–35 mole percent of said added metal or metals, in the presence of oxygen having a partial pressure of from $1 \times 10^{-6}$ to $1 \times 10^{-4}$ Torr.

2. Process of claim 1 in which the reactive gas containing oxygen is air.

3. Process of claim 1 in which oxygen is supplied to the target containing the metals to be atomized.

4. Process of claim 1 in which the partial pressure of oxygen and the metal atomization rate is adjusted so that the resistor film applied is a metal oxide film.

5. Process of claim 1 in which the partial pressure of oxygen and the metal atomization rate is adjusted so that the resistor film applied is of a metallic nature.

6. Process of claim 1 in which gold is the added metal.

7. Process of claim 1 including the further step of coiling the resistor film to adjust the nominal resistor value.

8. Process of claim 1 including the further step of coating the resistor film with a silicone lacquer.

9. Process of claim 1 including the further step of embedding the carrier member and the resistor film located thereupon in plastic.

10. Process of claim 1 in which the resistor has a resistance range of between 1 Ohm to $10^6$ Ohm;
electrical stress of 1 Watt at ambient temperature of 70° C.;
temperature coefficient of $\leq 200 \times 10^{-6}$/° C.;
change in resistance of $\leq \pm 1\%$ after 1,000 hours at 70° C. and 1 Watt of electrical stress;
change in resistance of $\leq \pm 1.5\%$ after 10,000 hours at 70° C. and 1 Watt of electrical stress;
change in value under the effect of moisture $\leq \pm 0.5\%$;
and non-linearity (1,000 kOhm) $\geq 100$ dB.